US012740299B2

(12) United States Patent
Paek et al.

(10) Patent No.: US 12,740,299 B2
(45) Date of Patent: Sep. 15, 2026

(54) DISPLAY DEVICE AND METHOD FOR MANUFACTURING THE SAME

(71) Applicant: LG DISPLAY CO., LTD., Seoul (KR)

(72) Inventors: SeungHan Paek, Gyeonggi-do (KR); HyunJin An, Gyeonggi-do (KR); Kyungjae Yoon, Gyeonggi-do (KR); Jeonphill Han, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 820 days.

(21) Appl. No.: 18/050,986

(22) Filed: Oct. 29, 2022

(65) Prior Publication Data

US 2023/0209885 A1 Jun. 29, 2023

(30) Foreign Application Priority Data

Dec. 27, 2021 (KR) ........................ 10-2021-0188691

(51) Int. Cl.
*H10K 59/80* (2023.01)
*G02B 5/30* (2006.01)
*H10K 71/00* (2023.01)

(52) U.S. Cl.
CPC ....... *H10K 59/8792* (2023.02); *G02B 5/3033* (2013.01); *H10K 59/8794* (2023.02); *H10K 71/00* (2023.02)

(58) Field of Classification Search
CPC ........... H10K 59/8791; H10K 59/8792; H10K 59/8793; H10K 59/8794; H10K 71/00; H10K 50/86; H10K 50/841; H10K 50/844; H10K 50/87; H10K 71/851; H10K 77/10; G02B 5/30; G02B 5/3025; G02B 5/3033; G02B 5/3041; G02B 5/305
See application file for complete search history.

(56) References Cited

U.S. PATENT DOCUMENTS

2009/0185101 A1* 7/2009 Matsuhira ............. G02F 1/1339 445/24
2015/0062101 A1* 3/2015 Kim ..................... G09G 3/3233 345/82
2018/0080628 A1* 3/2018 Feng ......................... F21V 9/14
2021/0149089 A1 5/2021 Chen et al.
2021/0191188 A1 6/2021 Yu
(Continued)

FOREIGN PATENT DOCUMENTS

CN 106125359 A 11/2016
CN 110824750 A 2/2020
(Continued)

OTHER PUBLICATIONS

Office Action in Korean Appln. No. 10-2021-0188691, mailed on Jul. 16, 2025, 11 pages (with English translation).

*Primary Examiner* — Stephone B Allen
*Assistant Examiner* — Adam W Booher
(74) *Attorney, Agent, or Firm* — Fish & Richardson P.C.

(57) ABSTRACT

A display device is provided, which prevents light leakage from occurring and allows an edge of a display panel not to be visible. The display device can include a glass substrate provided with a plurality of pixels, a polarizing film provided over the glass substrate, a side coating layer provided over a side of the glass substrate to fill a step difference between the glass substrate and the polarizing film, and a rear coating layer provided below the glass substrate.

11 Claims, 14 Drawing Sheets

(56) References Cited

U.S. PATENT DOCUMENTS

| | | | | |
|---|---|---|---|---|
| 2021/0376270 | A1* | 12/2021 | Li | H10K 59/8791 |
| 2023/0090105 | A1* | 3/2023 | Shin | H01L 25/0753 257/91 |

FOREIGN PATENT DOCUMENTS

| | | | |
|---|---|---|---|
| CN | 111025730 | A | 4/2020 |
| CN | 215219369 | U | 12/2021 |
| KR | 10-2014-0038306 | A | 3/2014 |
| KR | 10-2014-0118346 | A | 10/2014 |
| KR | 20170048440 | A | 5/2017 |
| KR | 20190062667 | A | 6/2019 |
| KR | 20190081337 | A | 7/2019 |
| KR | 20210086029 | A | 7/2021 |

* cited by examiner

DISPLAY DEVICE AND METHOD FOR MANUFACTURING THE SAME

CROSS-REFERENCE TO RELATED APPLICATION

This application claims the priority of Korean Patent Application No. 10-2021-0188691 filed on Dec. 27, 2021, which is hereby incorporated by reference in its entirety.

BACKGROUND

Field of the Disclosure

The present disclosure relates to a display device and a method for manufacturing the same.

Description of the Background

A display device includes various display elements, such as a liquid crystal display element or an organic light emitting element, in a display area. The display device may include a display panel provided with a plurality of light emitting elements formed on a glass substrate, and a polarizing film disposed on the display panel.

The polarizing film may be formed to have an area smaller than that of the glass substrate so that interference does not occur during a grinding process for grinding an end of the glass substrate when being disposed on the display panel. At this time, an end of the polarizing film may be provided over an inner side of the glass substrate. For this reason, problems occur in that light leakage occurs at an edge of the display panel and the edge is visible to a viewer.

SUMMARY

The present disclosure has been made in view of the above problems and it is an object of the present disclosure to provide a display device that prevents light leakage from occurring and allows an edge of a display panel not to be visible.

It is another object of the present disclosure to provide a display device that may improve side rigidity of a display panel.

In addition to the objects of the present disclosure as mentioned above, additional objects and features of the present disclosure will be clearly understood by those skilled in the art from the following description of the present disclosure.

In one aspect, a display device includes a glass substrate including a plurality of pixels, a polarizing film provided over the glass substrate, a side coating layer provided over a side of the glass substrate to fill a step difference between the glass substrate and the polarizing film, and a rear coating layer provided below the glass substrate.

In another aspect, ends of the polarizing film and the side coating layer are aligned.

In another aspect, an end of the polarizing film is more protruded than that of the glass substrate.

In another aspect, the polarizing film has a first length that is longer than a second length of the glass substrate, resulting in the step difference.

In another aspect, the display device further includes a cover substrate provided over the polarizing film, and an adhesive layer provided between the polarizing film and the cover substrate, wherein the adhesive layer has the same end as that of the polarizing film.

In another aspect, at least one side of the glass substrate has an inclined surface, and the side coating layer is provided to at least partially cover the inclined surface of the glass substrate.

In another aspect, the rear coating layer is provided to at least partially cover the glass substrate and the side coating layer.

In another aspect, the display device further includes an etch stop layer provided between the side coating layer and the polarizing film.

In another aspect, the display device further includes a heat dissipation film below the rear coating layer.

In another aspect, the side coating layer is made of an organic material that absorbs light.

In another aspect, the side coating layer and the rear coating layer are made of the same material.

In one aspect, a method for manufacturing a display device includes forming a plurality of display cells over a glass substrate and forming an etch stop layer along an etching line between two adjacent display cells of the plurality of display cells, forming an etching groove along the etching line by wet-etching the glass substrate, forming a side coating layer in the etching groove; and cutting, using a laser, the side coating layer.

In another aspect, the etching groove is formed by performing etching from a lower surface of the glass substrate to the etch stop layer.

In another aspect, the method further includes forming a polarizing film over the plurality of display cells, forming an adhesive film over the polarizing film, and simultaneously cutting the polarizing film and the adhesive film by using a laser.

In another aspect, the polarizing film and the adhesive film are simultaneously cut along a cutting line corresponding to the etching line.

In another aspect, the polarizing film and the adhesive film are simultaneously cut together with the side coating layer provided in the etching groove.

In another aspect, the method further includes forming a rear coating layer over a rear surface of the glass substrate, wherein the side coating layer provided in the etching groove and the rear coating layer are simultaneously cut using a laser.

In one aspect, a display device includes a glass substrate having a first length, a polarizing film provided over the glass substrate having a second length, a side coating layer provided over a side of the glass substrate to fill a gap at each end of the glass substrate resulting from a difference between the first length of the glass substrate and the second length of the polarizing film, and a rear coating layer provided below the glass substrate.

In another aspect, the side coating layer aligns the ends of the glass substrate and the polarizing film.

In another aspect, wherein the side coating layer is formed of either an organic material that absorbs light or an organic material having an optical density (OD) of at least 1.0.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
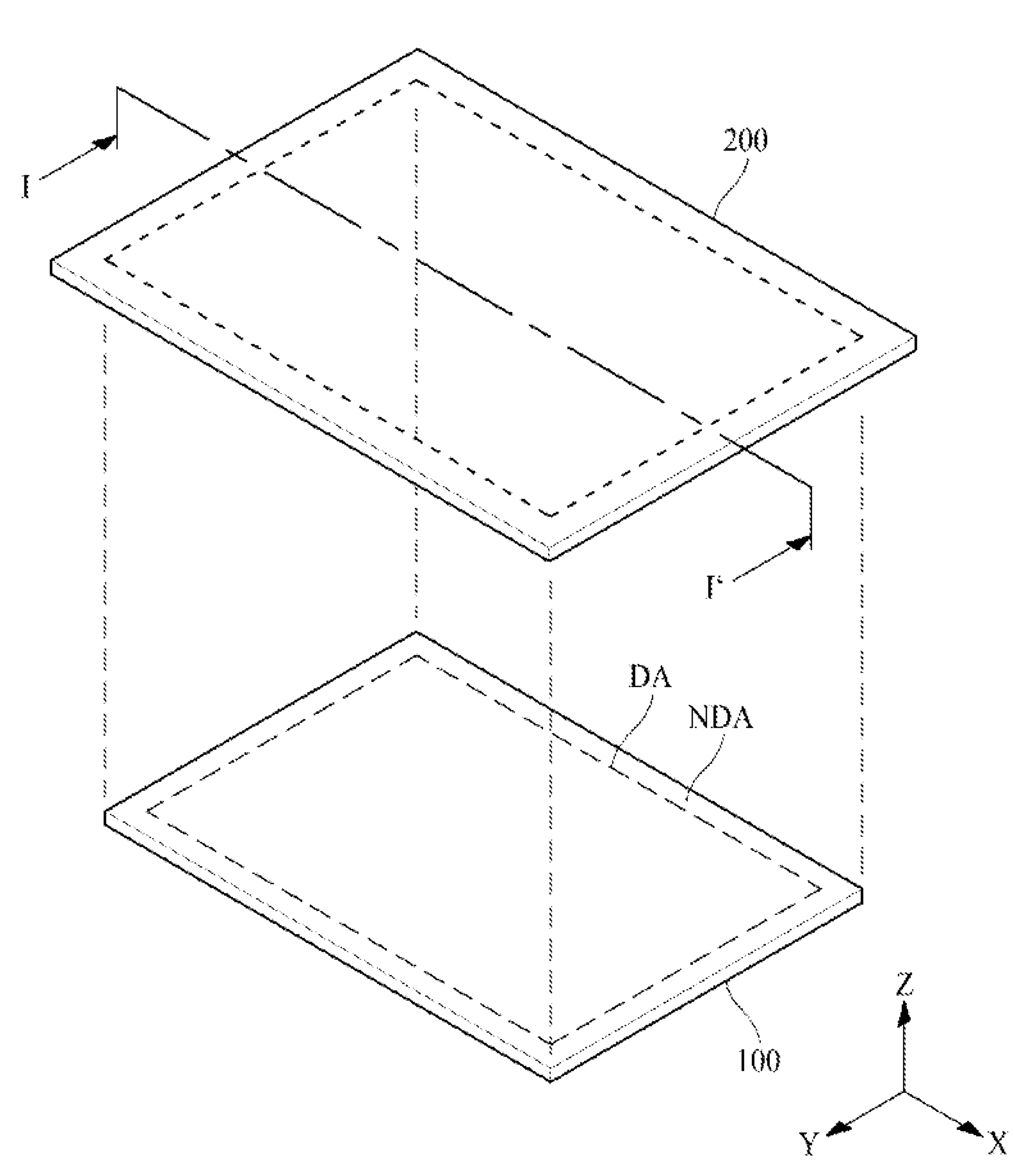
FIG. 1 is a perspective view illustrating a transparent display device according to some aspects of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Figure 2:
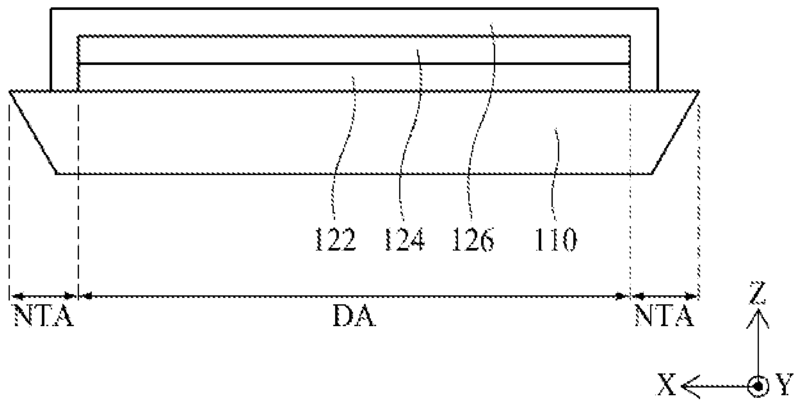
FIG. 2 is a schematic view illustrating elements of a display panel of FIG. 1 according to some aspects of the present disclosure.

FIG. 1 is a perspective view illustrating a transparent display device according to some aspects of the present disclosure, and FIG. 2 is a schematic view illustrating elements of a display panel of FIG. 1 according to some aspects of the present disclosure.

Hereinafter, X axis indicates a line parallel with a scan line, Y axis indicates a line parallel with a data line, and Z axis indicates a height direction of a display device.

The display device 10, according to one embodiment of the present disclosure, is embodied as an organic light emitting display device. However, the display device 10 may alternatively be embodied as an electroluminescence display such as a Quantum dot Light Emitting Display (QLED).

As shown in FIG. 1, a display device 10 according to one embodiment of the present disclosure may include a display panel 100 and a cover substrate 200.

The display panel 100 can display an image, and may include a substrate 110, a circuit element layer 122, a light emitting element layer 124 and an encapsulation layer 126 as shown in FIG. 2.

The substrate 110 may be disposed to face the cover substrate 200, and may be a glass substrate. Hereinafter, it is assumed that the substrate 110 is a glass substrate.

The circuit element layer 122 is provided over one surface of the glass substrate 110 facing the cover substrate 200. A circuit element, which includes various signal lines, a thin film transistor and a capacitor, is provided for each pixel in the circuit element layer 122. The signal lines may include a scan line, a data line, a driving power line, a common power line and a reference line, and the thin film transistor may include a switching thin film transistor, a driving thin film transistor and a sensing thin film transistor.

The switching thin film transistor is switched in accordance with a scan signal supplied to the scan line to supply a data voltage supplied from the data line to the driving thin film transistor.

The driving thin film transistor is switched in accordance with the data voltage supplied from the switching thin film transistor to generate a data current from a power source supplied from the driving power line to supply the data current to a first electrode of a pixel.

The sensing thin film transistor serves to sense a threshold voltage deviation of the driving thin film transistor which causes deterioration of image quality, and supplies the current of the driving thin film transistor to the reference line in response to a sensing control signal supplied from the gate line or a separate sensing line.

The capacitor serves to maintain the data voltage supplied to the driving thin film transistor for one frame, and is connected to a gate terminal and a source terminal of the driving thin film transistor, respectively.

The light emitting element layer 124 is provided over the circuit element layer 122. The light emitting element layer 124 includes a plurality of light emitting elements. Each of the plurality of light emitting elements includes first electrodes, a light emitting layer and a second electrode. The light emitting layer may be an organic light emitting layer that includes an organic material. In this case, the light emitting layer may include a hole transporting layer, an organic light emitting layer and an electron transporting layer. When a voltage is applied to the first electrode and the second electrode, holes and electrons move to the organic light emitting layer through the hole transporting layer and the electron transporting layer, respectively and are combined with each other in the organic light emitting layer to emit light. The light emitting element layer 124 may be a pixel array layer in which pixels are provided, and thus, an area in which the light emitting element layer 124 is provided may be defined as a display area DA. A peripheral area of the display area may be defined as a non-display area NDA.

The encapsulation layer 126 is provided over the light emitting element layer 124. The encapsulation layer 126 serves to prevent oxygen or moisture from being permeated into the light emitting element layer 124. The encapsulation layer 126 may include at least one inorganic layer and at least one organic layer.

Figure 3:
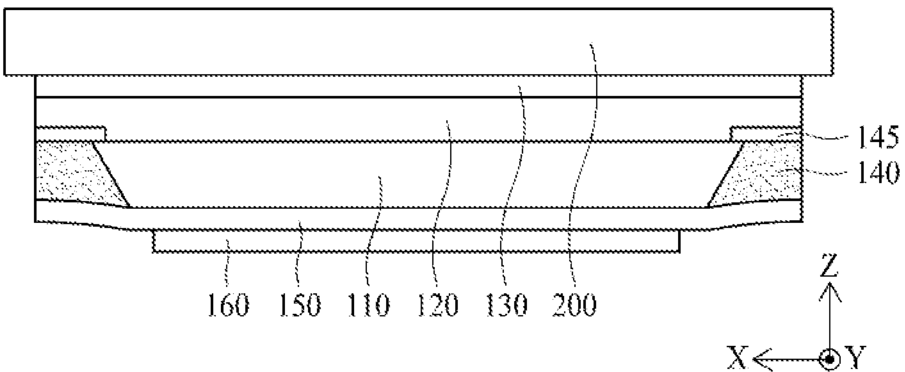
FIG. 3 is a cross-sectional view illustrating an example of I-I' of FIG. 1 according to some aspects of the present disclosure.
Figure 4:
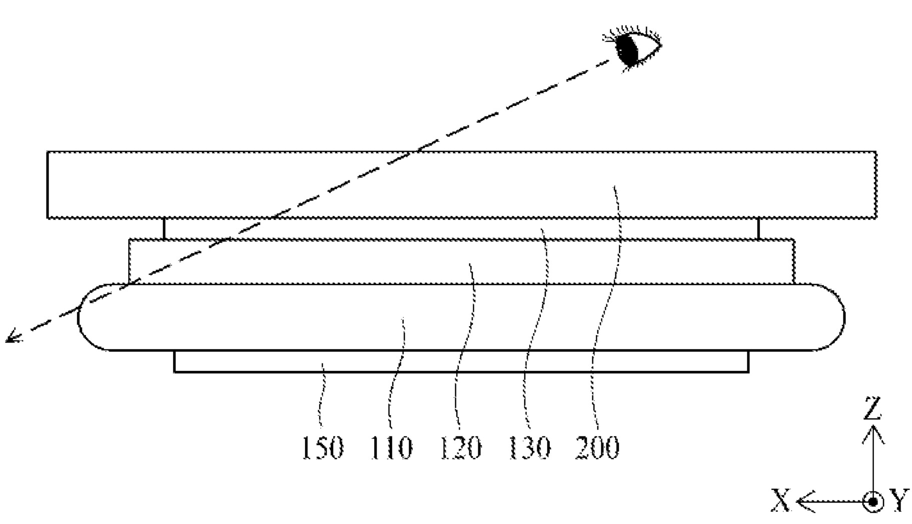
FIG. 4 illustrates that an end of a glass substrate is more protruded than that of a polarizing film according to some aspects of the present disclosure.
Figure 5:
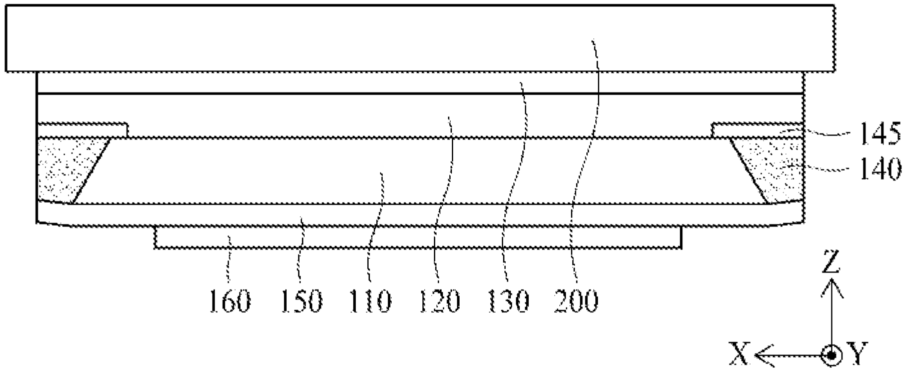
FIG. 5 is a cross-sectional view illustrating a modified example of FIG. 3 according to some aspects of the present disclosure.
Figure 6:
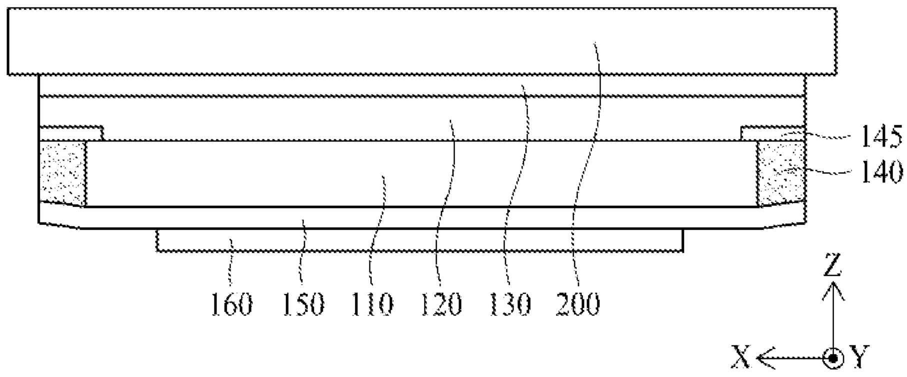
FIG. 6 is a cross-sectional view illustrating another modified example of FIG. 3 according to some aspects of the present disclosure.
Figure 7:
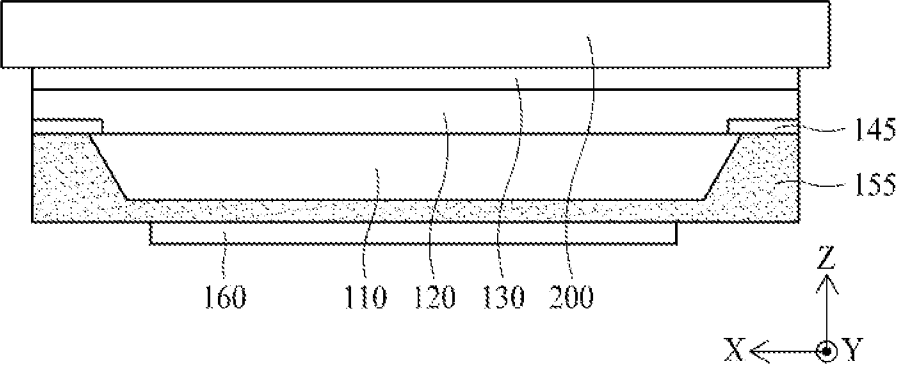
FIG. 7 is a cross-sectional view illustrating other modified example of FIG. 3 according to some aspects of the present disclosure.

The cover substrate 200 may include plastic or glass, and is disposed over the display panel 100. In FIG. 1, the display panel 100 is shown as being a front emission type, but is not limited thereto. The cover substrate 200 is preferably disposed in a direction in which the display panel 100 emits light. Therefore, when the display panel 100 is a front emission type, the cover substrate 200 is preferably disposed over the display panel 100. When the display panel 100 is a rear emission type, the cover substrate 200 may be disposed below the display panel 100. Hereinafter, for convenience of description, the display panel 100 will be described as a front emission type FIG. 3 is a cross-sectional view illustrating an example of I-I' of FIG. 1 according to some aspects of the present disclosure. FIG. 4 illustrates that an end of a glass substrate is more protruded than that of a polarizing film according to some aspects of the present disclosure. FIG. 5 is a cross-sectional view illustrating a modified example of FIG. 3 according to some aspects of the present disclosure. FIG. 6 is a cross-sectional view illustrating another modified example of FIG. 3 according to some aspects of the present disclosure. FIG. 7 is a cross-sectional view illustrating other modified example of FIG. 3 according to some aspects of the present disclosure.

For convenience of description, although the glass substrate 110 instead of the display panel 100 is shown in FIG. 3, the circuit element layer 122, the light emitting element layer 124 and the encapsulation layer 126, which are provided over the glass substrate 110, are not excluded. Hereinafter, the glass substrate 110 refers to the glass substrate 110 that includes the circuit element layer 122, the light emitting element layer 124 and the encapsulation layer 126.

In the display device 10, according to one embodiment of the present disclosure, a polarizing film 120 and an adhesive layer 130 may be provided between the glass substrate 110 and the cover substrate 200.

The polarizing film 120 is disposed over the glass substrate 110 to overlap at least a portion of the glass substrate 110. In more detail, the polarizing film 120 may be disposed to overlap a display area of the glass substrate 110, thereby preventing deterioration of visibility due to reflection of external light. The polarizing film 120 may have an area wider than that of the glass substrate 110, and its end may be more protruded than the glass substrate 110. That is, the glass substrate 110 may be provided in the area where the polarizing film 120 is provided. In the display device 10 according to one embodiment of the present disclosure, since the end of the polarizing film 120 may be disposed at the outermost area, it is advantageous to make sure of a viewing angle.

The adhesive layer 130 is disposed over the polarizing film 120 to overlap at least a portion of the polarizing film 120. The adhesive layer 130 may be provided between the polarizing film 120 and the cover substrate 200 to bond the polarizing film 120 to the cover substrate 200.

The adhesive layer 130 may have the same area as that of the polarizing film 120, and its end may be disposed at the same position as that of the cover substrate 200. In detail, the adhesive layer 130 may be provided over the polarizing film 120 and then cut using a laser simultaneously with the polarizing film 120 using a laser. Therefore, the end of the adhesive layer 130 may be provided at the same position as that of the polarizing film 120.

Since the adhesive layer 130 has the same area as that of the polarizing film 120, the adhesive layer 130 may have an area wider than that of the glass substrate 110. Therefore, the end of the adhesive layer 130 may be more protruded than the glass substrate 110.

Since the end of the polarizing film 120 and the end of the adhesive layer 130 are more protruded than that of the glass substrate 110 (i.e., the polarizing film 120 and the adhesive layer 130 may have the same length that is longer that the length of the glass substrate 110), a step difference with the glass substrate 110 (e.g., a misalignment between edges of the glass substrate 110 and that of the polarizing film 120 and the end of the adhesive layer 130 or a gap between the ends of the glass substrate 110 and that of the polarizing film 120 and the end of the adhesive layer 130) may occur. The display device 10 according to one embodiment of the present disclosure may include a side coating layer 140 to fill the step difference between the glass substrate 110 and the polarizing film 120.

In detail, the side coating layer 140 may be provided to fill the step between the glass substrate 110 and the polarizing film 120 over the side of the glass substrate 110. In this case, the side coating layer 140 may be in contact with a lower surface of the polarizing film 120, which is exposed as the polarizing film 120 is protruded from the end of the glass substrate 110. The side coating layer 140 may be using a laser simultaneously with the polarizing film 120, and thus its end may be provided at the same position as the end of the polarizing film 120.

In addition, the side coating layer 140 may be provided to at least partially cover the side of the glass substrate 110. Therefore, the side coating layer 140 may improve side rigidity of the glass substrate 110.

As shown in FIG. 3, the glass substrate 110 may have an inclined side in accordance with a manufacturing process as shown in FIG. 3. In the manufacturing process of the display panel 100, a plurality of display cells may be simultaneously formed on a mother board. Then, the plurality of display cells may be individually separated through a process of separating the plurality of display cells, and thus may serve as the display panel 100, respectively. In this case, the mother board of each of the plurality of separated display cells may correspond to the glass substrate 110.

In one embodiment, the plurality of display cells may be individually separated through a wet etching process using hydrofluoric acid. The glass substrate 110 of the display panel 100 may have an inclined side inclined by a wet etching process, and its end may be formed to be sharpened. This sharpened end can be a safety concern for any individual during handling of the glass substrate 110. In addition, when any force or weight is exerted on the side of the glass substrate 110, the end of the glass substrate 110 may be easily damaged.

In the display device 10 according to one embodiment of the present disclosure, as the side coating layer 140 is provided to at least partially cover the inclined side of the glass substrate 110, the sharp end of the display device 10 may be covered by the side coating layer 140. Therefore, the safety of an individual in charge of handling the glass substrate 110 may be ensured. In addition, since the side coating layer 140 serves as a buffer when a force or weight is applied to the side of the glass substrate 110, side rigidity of the glass substrate 110 may be improved.

Meanwhile, the side coating layer 140 may be made of an organic material that absorbs light. In one embodiment, the side coating layer 140 may be made of an organic material having an optical density (OD) of 1.0 or more.

In the display device 10 according to the exemplary embodiment of the present disclosure, the side coating layer 140 including a material absorbing light is disposed over the side of the glass substrate 110, so that light leakage may be prevented from occurring in the display area of the display panel 100. Therefore, the display device 10 according to one embodiment of the present disclosure may prevent the end of the glass substrate 110 from being visible.

In one example, a plurality of display cells formed over a mother board may be separated through a scribing process. Since the glass substrate 110 of the display panel 100 separated through the scribing process is formed to have a rough side, a grinding process may be performed on the rough side of the glass substrate 110. In this case, the polarizing film 120 may be formed to have an area smaller than that of the glass substrate 110 on the glass substrate 110 so that interference does not occur during the grinding process. That is, as shown in FIG. 4, the polarizing film 120 may be disposed in the area where the glass substrate 110 is provided.

When the end of the glass substrate 110 is more protruded than the end of the polarizing film 120 as shown in FIG. 4 and a viewing angle is narrow, light leakage may occur in the display area of the display panel 100, and the end of the glass substrate 110 may be visible to a viewer.

One solution to prevent light leakage from occurring, may be to coat the sides of the glass substrate 110 and the polarizing film 120 with an organic material that absorbs light. However, it may not be easy to coat such an organic material due to many step differences generated between the glass substrate 110 and the cover substrate 200. The step differences generated between the glass substrate 110 and the cover substrate 200 are formed to be concave inward from the outside, and thicknesses of the polarizing film 120 and the adhesive layer 130 are not large, whereby an organic material having viscosity may not completely fill the step differences to cause a defect.

On the other hand, in the display device 10 according to one embodiment of the present disclosure, unlike the display device shown in FIG. 4, the end of the polarizing film 120 may be more protruded than the end of the glass substrate 110. Therefore, in the display device 10 according to one embodiment of the present disclosure, the organic material absorbing light may be easily formed to fill the step difference between the glass substrate 110 and the polarizing film 120, whereby a coating defect may be avoided.

As described above, in the display device 10 according to one embodiment of the present disclosure, since the step difference between the glass substrate 110 and the polarizing film 120 on the side of the glass substrate 110 may be filled by the side coating layer 140, various inclined sides of the glass substrate 110 may be formed.

As shown in FIG. 3, the glass substrate 110 may be formed, such that a width of an upper surface is greater than that of a lower surface, to have a reverse tapered side but is not limited thereto. In another embodiment, as shown in FIG. 5, the glass substrate 110 may be formed, such that the width of the upper surface is smaller than that of the lower surface, to have a forward tapered side. In other embodiment, as shown in FIG. 6, the glass substrate 110 may be formed, such that the width of the upper surface is the same as that of the lower surface, to have a side perpendicular to the upper surface and the lower surface. As described above, in the display device 10 according to one embodiment of the present disclosure, even though sides of varying shapes and sizes for the glass substrate 110 are formed, the glass substrate 110 may be covered by the side coating layer 140, whereby the degree of freedom in design may be increased with respect to the shape of the glass substrate 110.

The display device 10 according to one embodiment of the present disclosure may include a rear coating layer 150 provided below the glass substrate 110. The rear coating layer 150 may be provided below the glass substrate 110 to cover the entire rear surface of the glass substrate 110. The rear coating layer 150 may protect the rear surface of the glass substrate 110 so as to cause damage to the glass substrate 110. In addition, the rear coating layer 150 may include an organic material to perform a buffering function so that an external impact is not transferred to the display panel 100.

The rear coating layer 150 may be further extended from the rear surface of the glass substrate 110 to the side coating layer 140. In the display device 10 according to one embodiment of the present disclosure, the rear coating layer 150 is provided to at least partially cover the side coating layer 140, so that a bonding force of the rear coating layer 150 may be improved. The rear coating layer 150 may be provided only over the rear surface of the glass substrate 110 to protect the glass substrate 110. However, since the rear coating layer 150 made of an organic material has a relatively low bonding force with the glass substrate 110, the rear coating layer 150 may be peeled from the glass substrate 110 by an external force or impact. In the display device 10 according to one embodiment of the present disclosure, the rear coating layer 150 is in contact with the side coating layer 140 made of an organic material at the outside of the glass substrate 110, so that the bonding force of the rear coating layer 150 may be improved. As a result, in the display device 10 according to one embodiment of the present disclosure, peeling of the rear coating layer 150 from the glass substrate 110 can be prevented.

In FIGS. 3, 5 and 6, the side coating layer 140 and the rear coating layer 150 are shown as being separate elements, but are not limited thereto. In another embodiment, the display device 10 may include a coating layer 155 in which the side coating layer 140 and the rear coating layer 150 are integrally formed. As shown in FIG. 7, the coating layer 155 may be provided over the rear surface and the side of the glass substrate 110. In this case, the coating layer 155 may be made of an organic material that absorbs light.

The display device 10 according to one embodiment of the present disclosure may further include a heat dissipation film 160 below the rear coating layer 150. The heat dissipation film 160 may include a material having high thermal conductivity so as to effectively dissipate heat generated from the display panel 100.

In addition, the display device 10 according to one embodiment of the present disclosure may include an etch stop layer 145 between the side coating layer 140 and the polarizing film 120. The etch stop layer 145 may determine an etching depth when cutting the glass substrate 110 through a wet etching process. The cutting of the glass substrate 110 through the wet etching process will be described in more detail with reference to FIGS. 8 to 11.

Figure 8:
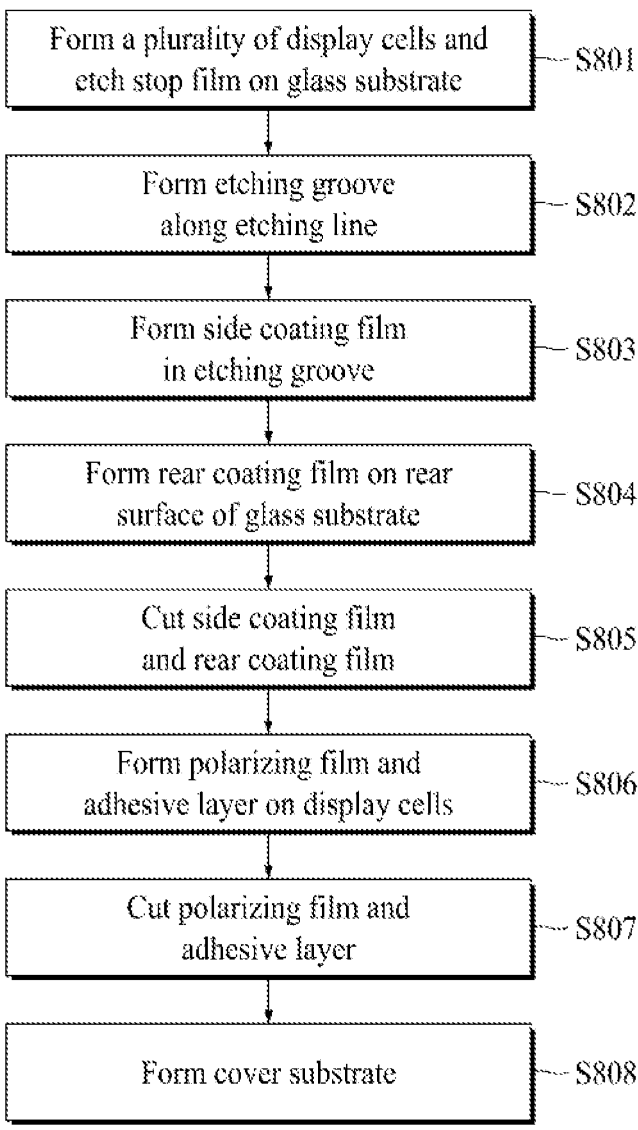
FIG. 8 is a flow chart illustrating a method for manufacturing a display device according to some aspects of the present disclosure.

FIG. 8 is a flow chart illustrating a method for manufacturing a display device according to some aspects of the present disclosure. and FIGS. 9A-9H are cross-sectional views illustrating a method for manufacturing a display device according to some aspects of the present disclosure.

First, a plurality of display cells DC and an etch stop layer 145 are formed over a glass substrate 110 (S801).

Figure 9A:
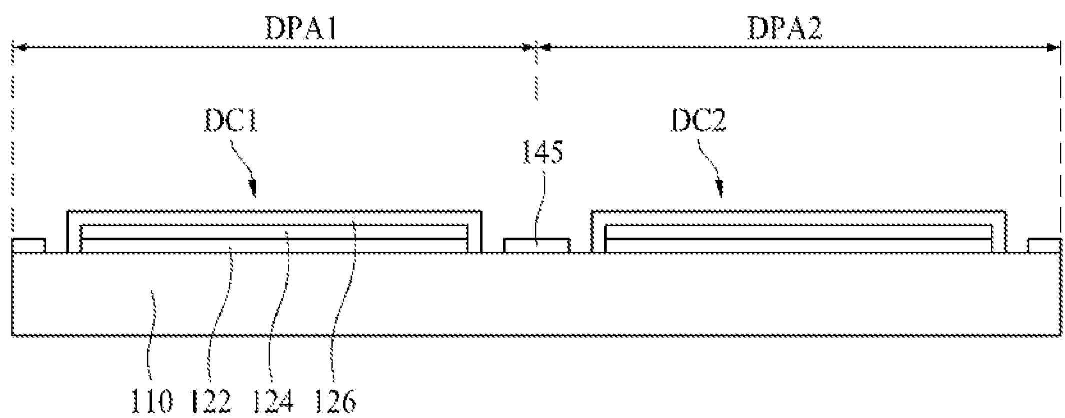
FIGS. 9A-9H are cross-sectional views illustrating a method for manufacturing a display device according to some aspects of the present disclosure.

In more detail, as shown in FIG. 9A, display cells DC1 and DC2 may be formed in a plurality of display panels DPA1 and DPA2, respectively, on the glass substrate 110. In this case, the glass substrate 110 may be a mother board.

A circuit element layer 122 may be formed over the glass substrate 110. A circuit element, which includes various signal lines, a thin film transistor and a capacitor, is provided for each pixel in the circuit element layer 122. The signal lines may include a scan line, a data line, a driving power line, a common power line and a reference line, and the thin film transistor may include a switching thin film transistor, a driving thin film transistor and a sensing thin film transistor.

A light emitting element layer 124 may be formed over the circuit element layer 122. The light emitting element layer 124 includes a plurality of light emitting elements. Each of the plurality of light emitting elements includes first electrodes, a light emitting layer and a second electrode. The light emitting layer may be an organic light emitting layer that includes an organic material. In this case, the light emitting layer may include a hole transporting layer, an organic light emitting layer and an electron transporting layer. When a voltage is applied to the first electrode and the second electrode, holes and electrons move to the organic light emitting layer through the hole transporting layer and the electron transporting layer, respectively and are combined with each other in the organic light emitting layer to emit light. The light emitting element layer 124 may be a pixel array layer in which pixels are formed, and thus an area in which the light emitting element layer 124 is formed may be defined as a display area. A peripheral area of the display area may be defined as a non-display area.

Then, an encapsulation layer 126 may be formed over the light emitting element layer 124. The encapsulation layer 126 serves to prevent oxygen or moisture from being permeated into the light emitting element layer 124. The encapsulation layer 126 may include at least one inorganic layer and at least one organic layer.

An etch stop layer 145 may be formed over the glass substrate 110 along an etching line. In this case, the etching line may be a line for partitioning the plurality of display panel areas DPA1 and DPA2, and may be provided between the plurality of display panel areas DPA1 and DPA2. The etch stop layer 145 may be formed of the same material as that of at least one of a plurality of insulating layers provided in the circuit element layer 122, the light emitting element layer 124 and the encapsulation layer 126. For example, a planarization layer for planarizing a step difference caused by the driving transistor may be provided between the driving transistor and the light emitting element in the circuit element layer 122. The etch stop layer 145 may be formed of the same material as that of the planarization layer, which is provided in the circuit element layer 122, simultaneously with the planarization layer.

Next, the glass substrate 110 is etched along the etching line to form an etching groove EG (S802).

Figure 9B:
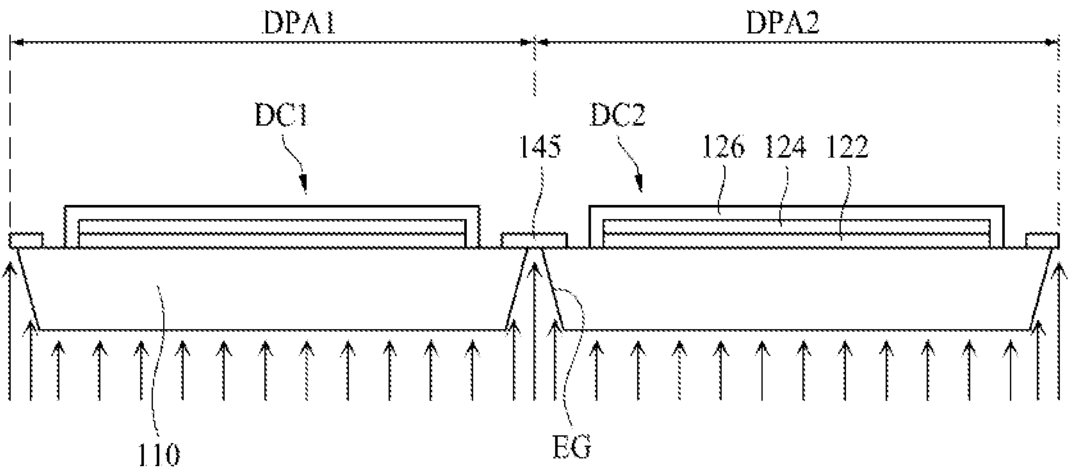

In more detail, as shown in FIG. 9B, the glass substrate 110 may be etched along the etching line through a wet etching process using hydrofluoric acid to form the etching groove EG. At this time, the etching process is performed from a lower surface of the glass substrate 110 to the etch stop layer 145, whereby the etching groove EG may be formed.

The etching groove EG may be formed through a wet etching process performed once, but is not limited thereto. In another embodiment, the etching groove EG may be formed through a plurality of wet etching processes depending on a thickness of the glass substrate 110. For example, a portion of the thickness of the glass substrate 110 may be etched along the etching line through a first wet etching process. Then, the other portion of the thickness of the glass substrate 110 may be etched along the etching line through a second wet etching process.

Next, a side coating layer 140 is formed in the etching groove EG (S803).

Figure 9C:
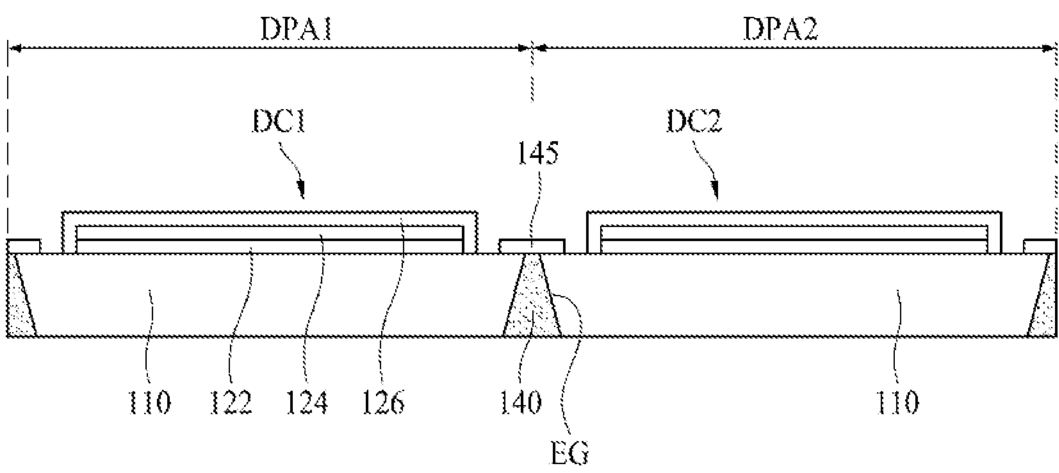

In more detail, as shown in FIG. 9C, a side coating material may be coated on the etching groove EG to form the side coating layer 140. The side coating material may be made of a colored organic material that absorbs light. In one embodiment, the side coating layer 140 may be made of an organic material having an optical density (OD) of 1.0 or more. The side coating material may be coated on the etching groove EG by an ink dispenser, but is not limited thereto. The side coating material may be coated on the etching groove EG by one of various methods known in the art.

Next, a rear coating layer 150 is formed over a rear surface of the glass substrate 110 (S804).

Figure 9D:
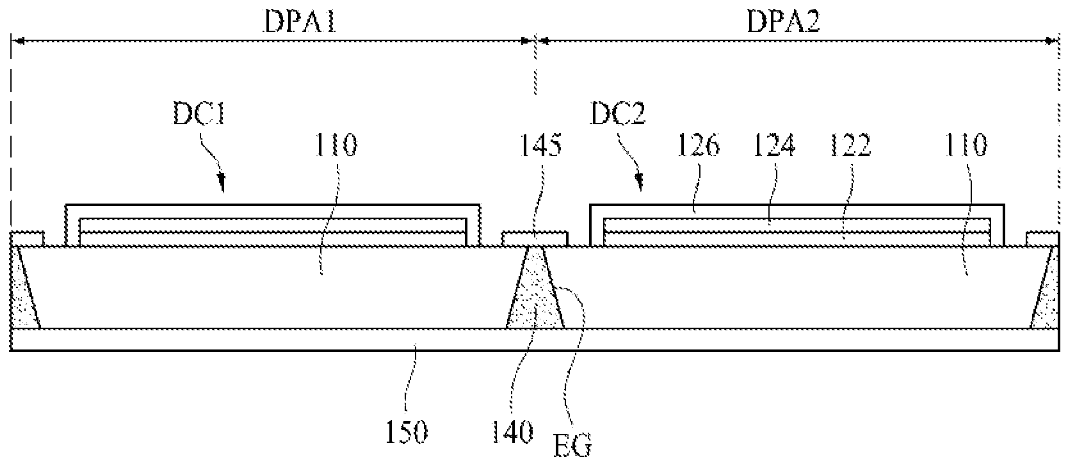

In more detail, as shown in FIG. 9D, a rear coating material may be coated on the entire rear surface of the glass substrate 110 to form the rear coating layer 150. The rear coating material may be made of an organic material. In this case, the organic material constituting the rear coating material may be a colorless transparent material, but is not limited thereto. The rear coating material may be made of a colored organic material. The rear coating material may be coated on the rear surface of the glass substrate 110 by a screen printer, but is not limited thereto. The rear coating material may be coated on the etch groove EG by one of various methods known in the art.

Next, the side coating layer 140 and the rear coating layer 150 are cut (S805).

Figure 9E:
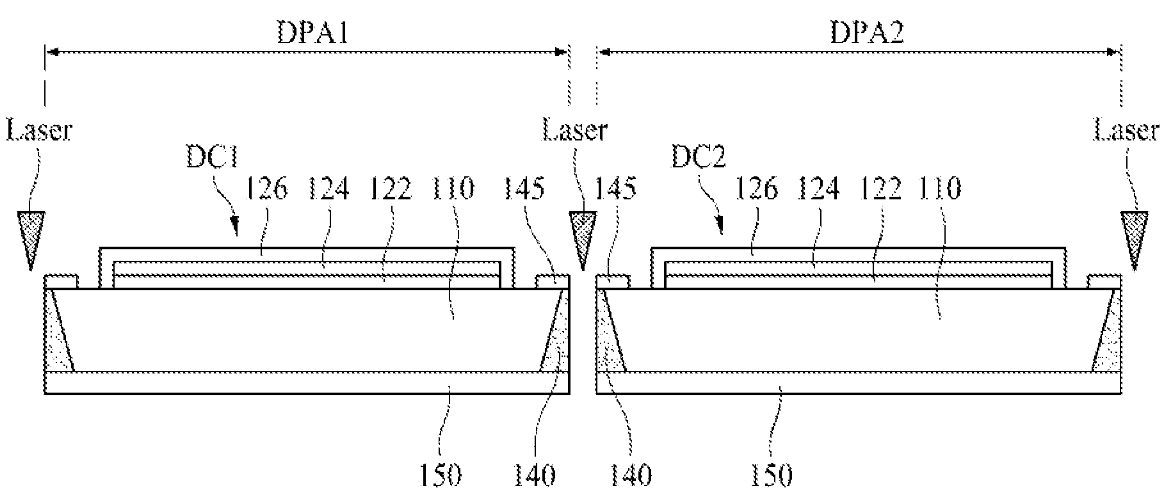

In more detail, as shown in FIG. 9E, the side coating layer 140 provided in the etching groove EG and the rear coating layer 150 provided over the rear surface of the glass substrate 110 may be cut along a first cutting line. In this case, the first cutting line may be a line for cutting the side coating layer 140 and the rear coating layer 150, and may be the same as the etching line by cutting the side coating layer 140 provided in the etching groove EG.

The glass substrate 110 is etched by a wet etching process so that the glass substrate 110 is not provided over the first cutting line. Therefore, the etch stop layer 145, the side coating layer 140 and the rear coating layer 150 may be provided over the first cutting line.

The etch stop layer 145, the side coating layer 140 and the rear coating layer 150 are all formed of an organic material, and thus may be simultaneously cut using a laser. Therefore, the etch stop layer 145, the side coating layer 140 and the rear coating layer 150 do not generate a step difference, and their ends may be formed at the same position.

When the etch stop layer 145, the side coating layer 140 and the rear coating layer 150 are cut, the plurality of display panels 110, each of which includes the plurality of display cells DC1 to DC2, may be individually separated.

Next, a polarizing film 120 and an adhesive film including an adhesive layer 130 are formed over the display cells DC1 and DC2 (S806).

Figure 9F:
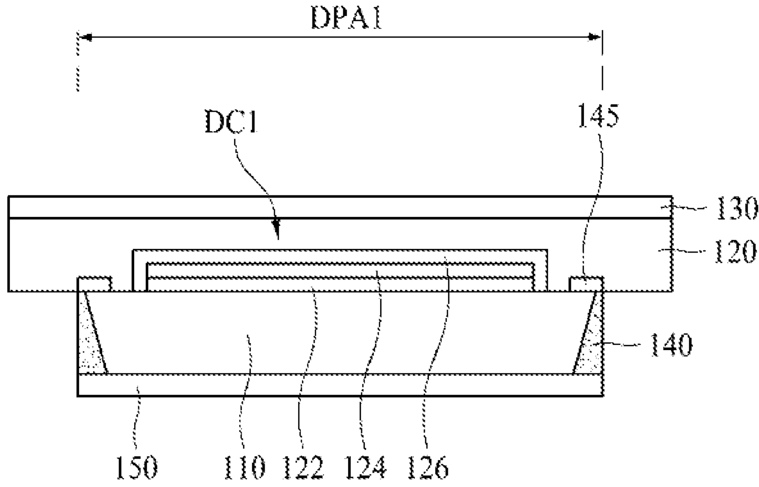

In more detail, as shown in FIG. 9F, after the polarizing film 120 is on the display cell DC1 of each of the plurality of display panels 110, the adhesive film including the adhesive layer 130 may be formed over the polarizing film 120. The adhesive film may include a base layer provided over the adhesive layer 130.

At this time, the polarizing film 120 and the adhesive layer 130, which are formed over the display cell DC1, may at least partially cover the display panel 110, and their ends may be formed to be more protruded than the end of the side coating layer 140.

Next, the polarizing film 120 and the adhesive film including the adhesive layer 130 are cut (S807).

Figure 9G:
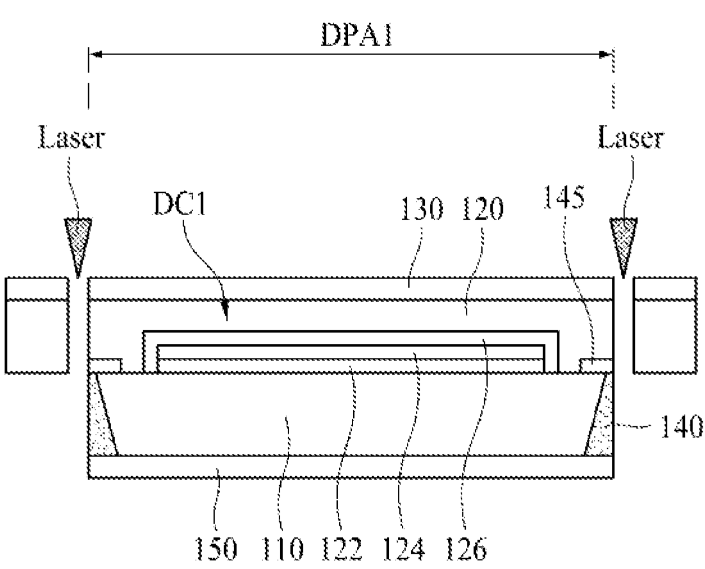

In more detail, as shown in FIG. 9G, the polarizing film 120 and the adhesive layer 130 may be cut along the second cutting line. In this case, the second cutting line may be a line for cutting the polarizing film 120 and the adhesive layer 130, and may be the same as the etching line but is not limited thereto. The second cutting line may be disposed inside the etching line, but in this case, the second cutting line may not overlap the glass substrate 110. The second cutting line may be disposed outside the etching line.

When the second cutting line is disposed to be the same as the etching line or disposed inside the etching line, all of the polarizing film 120, the adhesive film including the adhesive layer 130, the etch stop layer 145, the side coating layer 140 and the rear coating layer 150 are formed of an organic material, and thus may be simultaneously cut using a laser as shown in FIG. 9G. Therefore, the polarizing film 120, the adhesive film including the adhesive layer 130, the etch stop layer 145, the side coating layer 140 and the rear coating layer 150 do not generate a step difference, and their ends may be formed at the same position.

When the second cutting line is disposed outside the etching line, the polarizing film 120 and the adhesive film including the adhesive layer 130 may be simultaneously cut using a laser. The polarizing film 120 and the adhesive film including the adhesive layer 130 do not generate a step difference, and their ends may be formed at the same position. However, the polarizing film 120 and the adhesive film including the adhesive layer 130 may be formed at a position where their ends are more protruded than the etch stop layer 145, the side coating layer 140 and the rear coating layer 150.

Next, a cover substrate 200 is formed (S808).

Figure 9H:
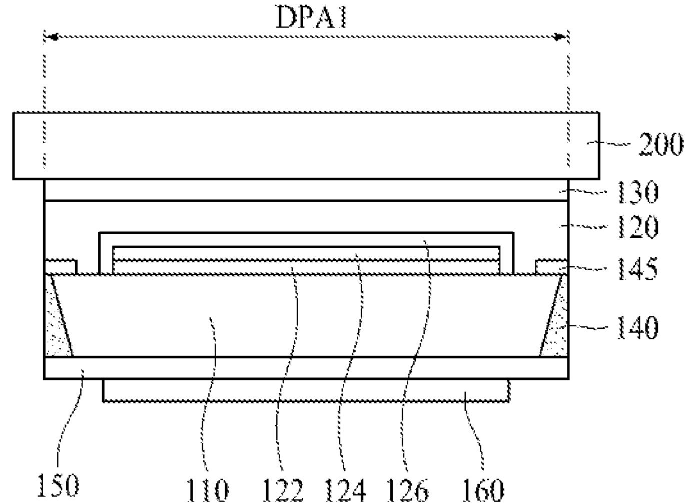

In more detail, as shown in FIG. 9H, the base layer of the adhesive film is removed, and the cover substrate 200 may be adhered onto the adhesive layer 130. In addition, a heat dissipation film 160 may be formed below the rear coating layer 150.

In steps S803 and S804 of FIG. 8, the side coating layer 140 and the rear coating layer 150 are formed through separate processes, but are not limited thereto. In another embodiment, the side coating layer 140 and the rear coating layer 150 may be formed through one process. In detail, the side coating layer 140 and the rear coating layer 150 may be simultaneously formed by coating a coating material on the etching groove EG and the rear surface of the glass substrate 110. In this case, the coating material may be made of a colored organic material that absorbs light.

In FIG. 8 and FIGS. 9A-H, the second laser cutting process for cutting the polarizing film 120 and the adhesive film is performed after the first laser cutting process for cutting the side coating layer 140 and the rear coating layer 150 is performed, but the present disclosure is not limited thereto. In another embodiment, the side coating layer 140, the rear coating layer 150, the polarizing film 120 and the adhesive film may be cut through a laser cutting process of one time as shown in FIG. 10 and FIGS. 11*a* to 11*g*.

Figure 10:
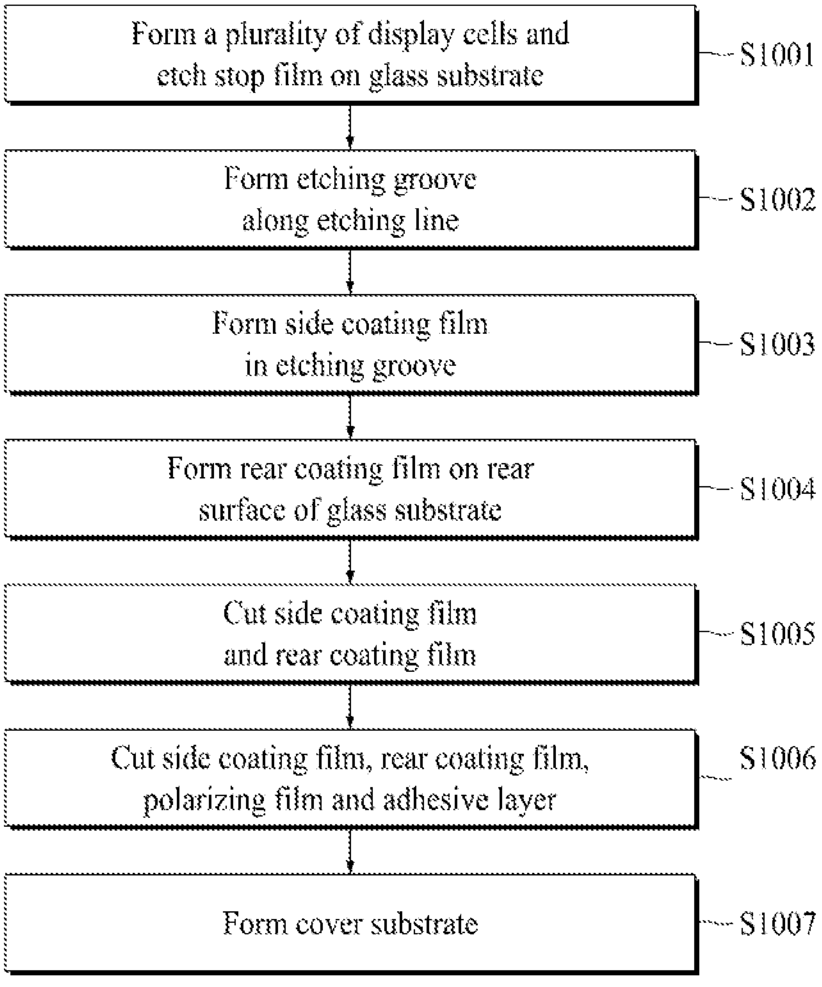
FIG. 10 is a flow chart illustrating another method for manufacturing a display device according to some aspects of the present disclosure.

FIG. 10 is a flow chart illustrating another method for manufacturing a display device according to some aspects of the present disclosure. FIGS. 11A-G are cross-sectional views illustrating another method for manufacturing a display device according to some aspects of the present disclosure.

Since processes of FIGS. 11A-D are substantially the same as those of FIGS. 9A-D, their detailed description will be omitted for sake of brevity.

First, a plurality of display cells DC and an etch stop layer 145 are formed over a glass substrate 110 (S1001). Next, an etching groove EG is formed by etching the glass substrate 110 along an etching line (S1002), and a side coating layer 140 is formed in the etching groove EG (S1003). Next, a rear coating layer 150 is formed over a rear surface of the glass substrate 110 (S1004).

Next, a polarizing film 120 and an adhesive film including the adhesive layer 130 are formed over the display cells DC1 and DC2 (S1005).

Figure 11A:
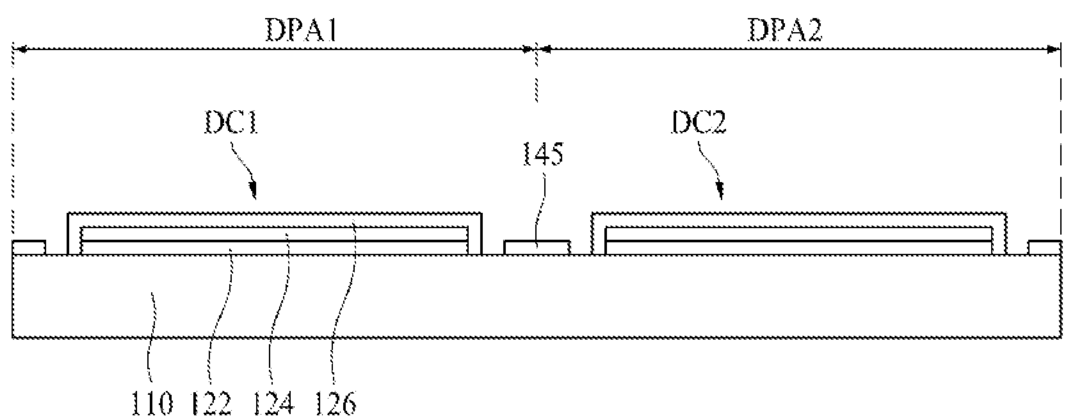
FIGS. 11A-11G are cross-sectional views illustrating another method for manufacturing a display device according to some aspects of the present disclosure.
Figure 11B:
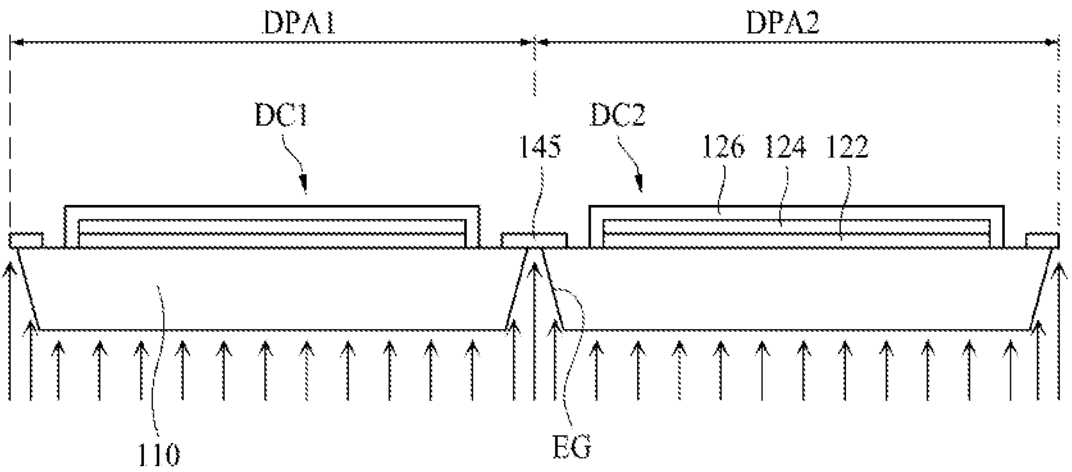
Figure 11C:
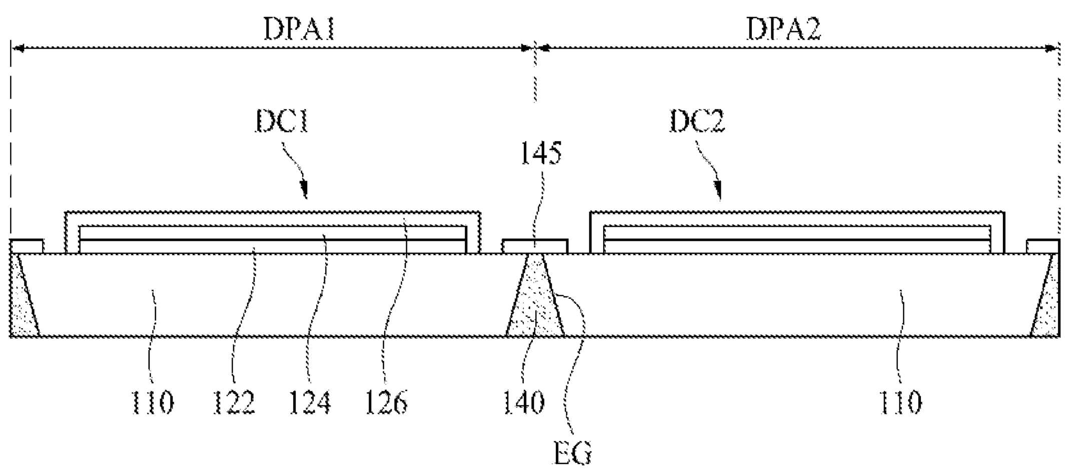
Figure 11D:
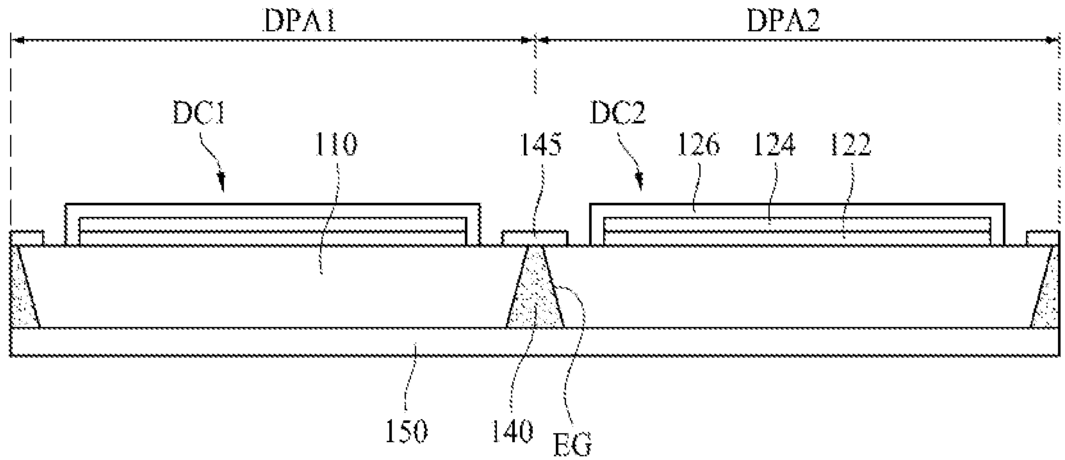
Figure 11E:
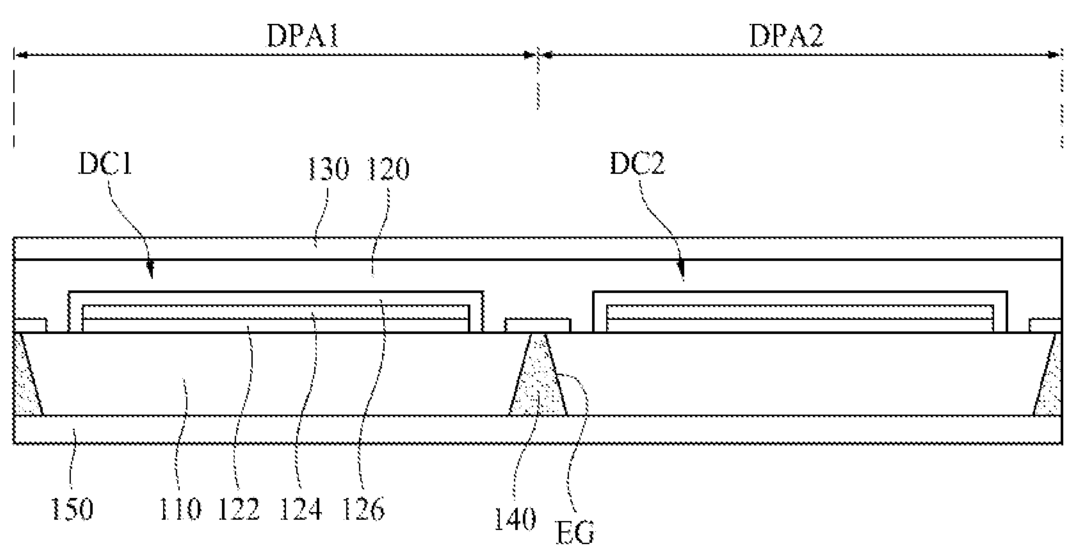

In more detail, as shown in FIG. 11E, after the polarizing film 120 is formed over the glass substrate 110 in which the plurality of display cells DC1 to DC2 are formed, the adhesive film including the adhesive layer 130 may be formed over the polarizing film 120. The adhesive film may include a base layer over the adhesive layer 130.

Next, the polarizing film 120 and the adhesive film including the adhesive layer 130, the side coating layer 140, the etch stop layer 145 and the rear coating layer 150 are cut (S1006).

Figure 11F:
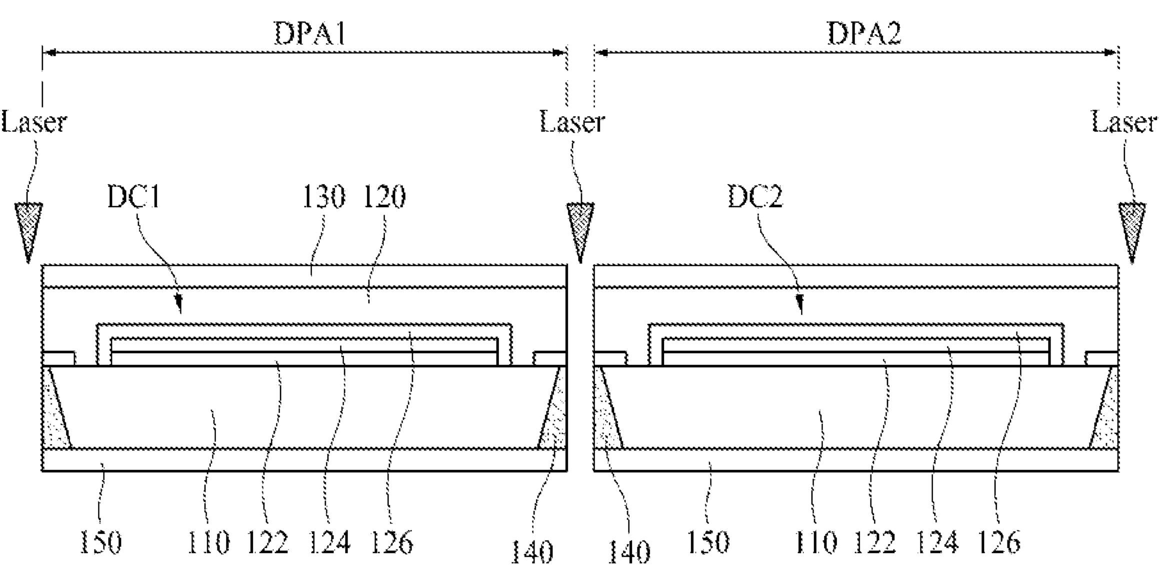

In more detail, as shown in FIG. 11F, the polarizing film 120, the adhesive film including the adhesive layer 130, the side coating layer 140, the etch stop layer 145 and the rear coating layer 150 may be cut along a cutting line. In this case, the cutting line may be a line for cutting the polarizing film 120, the adhesive film including the adhesive layer 130, the side coating layer 140, the etch stop layer 145 and the rear coating layer 150 at one time, and may be the same as the etching line but is not limited thereto. The cutting line may be disposed inside the etching line, but in this case, the cutting line may not overlap the glass substrate 110. The cutting line may be disposed outside the etching line.

The polarizing film 120, the adhesive film including the adhesive layer 130, the etch stop layer 145, the side coating layer 140 and the rear coating layer 150 are all formed of an organic material, and thus may be simultaneously cut using a laser as shown in FIG. 11*f*. Therefore, the polarizing film 120, the adhesive film including the adhesive layer 130, the etch stop layer 145, the side coating layer 140 and the rear coating layer 150 do not generate a step difference, and their ends may be formed at the same position.

Next, a cover substrate 200 is formed (S1007).

Figure 11G:
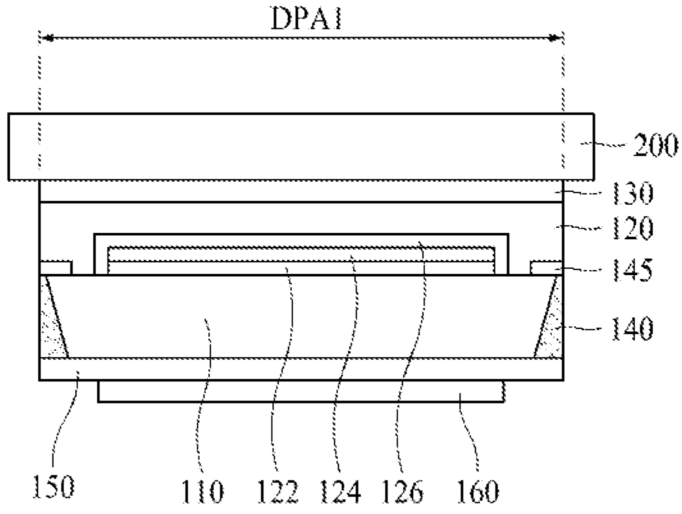

In more detail, as shown in FIG. 11G, the base layer of the adhesive film is removed, and the cover substrate 200 may be adhered onto the adhesive layer 130. In addition, a heat dissipation film 160 may be formed below the rear coating layer 150.

In another method for manufacturing the display device according to one embodiment of the present disclosure, since the polarizing film 120, the adhesive film including the adhesive layer 130, the etch stop layer 145, the side coating layer 140 and the rear coating layer 150 are cut through a laser cutting process of one time, the process may be simplified and shortened, and a defect due to a processing error may be avoided. Further, in another method for manufacturing the display device according to one embodiment of the present disclosure, since all ends of the polarizing film 120, the adhesive film including the adhesive layer 130, the etch stop layer 145, the side coating layer 140 and the rear coating layer 150 are disposed at the same position, a step difference is not generated.

According to the present disclosure, the following advantageous effects may be obtained.

In the present disclosure, since the glass substrate is cut through the wet etching process, a separate grinding process is not required. Therefore, the end of the polarizing film may be disposed to be more protruded than the end of the glass substrate to ensure proper viewing from different viewing angles.

Also, in the present disclosure, the side coating layer is formed over the side of the glass substrate, so that light leakage may be avoided, and the edge of the display panel may be prevented from being visible.

Also, in the present disclosure, the sharp end of the glass substrate is covered by the side coating layer, so that risk of injuries to individual when handling the glass substrate can be reduced, whereby side rigidity may be improved.

Also, in the present disclosure, the rear coating layer is formed over the rear surface of the glass substrate, so that damages to the glass substrate may be prevented, and effects of any external impact may be prevented from being transferred to the display panel.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display device comprising:
a glass substrate including a plurality of pixels;
a polarizing film provided over the glass substrate;
a side coating layer provided over a side of the glass substrate to fill a step difference between the glass substrate and the polarizing film;
a rear coating layer provided below the glass substrate; and
an etch stop layer provided between the side coating layer and the polarizing film,
wherein the rear coating layer is disposed to protrude beyond an end of the glass substrate and cover an entire rear surface of the glass substrate and an entire rear surface of the side coating layer.

2. The display device of claim 1, wherein ends of the polarizing film and the side coating layer are aligned.

3. The display device of claim 1, wherein an end of the polarizing film is more protruded than that of the glass substrate.

4. The display device of claim 1, wherein the polarizing film has a first length that is longer than a second length of the glass substrate, resulting in the step difference.

5. The display device of claim 1, further comprising:
a cover substrate provided over the polarizing film; and
an adhesive layer provided between the polarizing film and the cover substrate,
wherein the adhesive layer has the same end as that of the polarizing film.

6. The display device of claim 1, wherein at least one side of the glass substrate has an inclined surface, and the side coating layer is provided to at least partially cover the inclined surface of the glass substrate.

7. The display device of claim 1, further comprising:
a heat dissipation film below the rear coating layer.

8. The display device of claim 1, wherein the side coating layer is made of an organic material that absorbs light.

9. The display device of claim 1, wherein the side coating layer and the rear coating layer are made of the same material.

10. A display device comprising:
a glass substrate having a first length;
a polarizing film provided over the glass substrate having a second length;
a side coating layer provided over a side of the glass substrate to fill a gap at each end of the glass substrate resulting from a difference between the first length of the glass substrate and the second length of the polarizing film; and
a rear coating layer provided below the glass substrate,
wherein the rear coating layer is disposed to protrude beyond an end of the glass substrate and cover an entire rear surface of the glass substrate and an entire rear surface of the side coating layer, and
wherein the side coating layer aligns the ends of the glass substrate and the polarizing film.

11. The display device of claim 10, wherein the side coating layer is formed of either an organic material that absorbs light or an organic material having an optical density (OD) of at least 1.0.

* * * * *